United States Patent
Mankos

(10) Patent No.: US 7,692,167 B1
(45) Date of Patent: Apr. 6, 2010

(54) HIGH-FIDELITY REFLECTION ELECTRON BEAM LITHOGRAPHY

(75) Inventor: Marian Mankos, Palo Alto, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 688 days.

(21) Appl. No.: 11/588,492

(22) Filed: Oct. 26, 2006

(51) Int. Cl.
*H01J 37/302* (2006.01)
(52) U.S. Cl. ............... 250/492.23; 250/492.22
(58) Field of Classification Search ............ 250/492.23, 250/492.2
See application file for complete search history.

(56) References Cited

U.S. PATENT DOCUMENTS

| | | | |
|---|---|---|---|
| 4,418,283 A * | 11/1983 | Trotel | 250/492.2 |
| 4,859,856 A * | 8/1989 | Groves et al. | 250/398 |
| 5,136,169 A | 8/1992 | Smith et al. | |
| 5,523,580 A * | 6/1996 | Davis | 250/492.23 |
| 6,177,218 B1 | 1/2001 | Felker et al. | |
| 6,207,965 B1 | 3/2001 | Koike | |
| 6,235,450 B1 | 5/2001 | Nakasuji | |
| 6,291,119 B2 | 9/2001 | Choi et al. | |
| 6,333,508 B1 | 12/2001 | Katsap et al. | |
| 6,414,313 B1 | 7/2002 | Gordon et al. | |
| 6,429,443 B1 | 8/2002 | Mankos et al. | |
| 6,511,048 B1 | 1/2003 | Sohda et al. | |
| 6,525,328 B1 | 2/2003 | Miyoshi et al. | |
| 6,573,516 B2 | 6/2003 | Kawakami | |
| 6,586,733 B1 | 7/2003 | Veneklasen et al. | |
| 6,605,811 B2 | 8/2003 | Hotta et al. | |
| 6,610,890 B1 | 8/2003 | Garcia de Quesada Fort et al. | |
| 6,657,211 B2 | 12/2003 | Benner | |
| 6,674,086 B2 | 1/2004 | Kamada | |
| 6,870,172 B1 | 3/2005 | Mankos et al. | |

\* cited by examiner

*Primary Examiner*—Jack I Berman
(74) *Attorney, Agent, or Firm*—Okamoto & Benedicto LLP

(57) ABSTRACT

One embodiment pertains to an apparatus for reflection electron beam lithography, including at least illumination electron-optics, an electron-reflective pattern generator, projection electron-optics, a moving stage holding a target substrate, control circuitry, and a deflection system. The illumination electron-optics is configured to form an illumination electron beam. The electron-reflective pattern generator configured to generate an electron-reflective pattern of pixels and to reflect the illumination electron beam using the pattern to form a patterned electron beam. The projection electron-optics is configured to project the patterned electron beam onto the moving target substrate. The control circuitry is configured to shift the generated pattern in discrete steps in synchronization with the stage motion. The deflection system is configured to deflect said projected patterned electron beam so as to compensate for said stage motion in between discrete shifts of said generated pattern. Other features and embodiments are also disclosed.

20 Claims, 8 Drawing Sheets

HIGH-FIDELITY REFLECTION ELECTRON BEAM LITHOGRAPHY

GOVERNMENT LICENSE RIGHTS

The U.S. Government has a paid-up license in this invention and the right in limited circumstances to require the patent owner to license others on reasonable terms as provided for by the terms of Contract No. DAAD19-00-3-1001 awarded by the Defense Advanced Research Projects Agency.

BACKGROUND OF THE INVENTION

1. Field of the Invention

The present invention relates generally to semiconductor manufacturing and related technologies. More particularly, the present invention relates to electron beam lithography.

2. Description of the Background Art

A lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed. Electron beam lithographic systems may be categorized as electron-beam direct write (EBDW) lithography systems and electron beam projection lithography systems.

In EBDW lithography, the substrate is sequentially exposed by means of a focused electron beam, wherein the beam either scans in the form of lines over the whole specimen and the desired structure is written on the object by corresponding blanking of the beam, or, as in a vector scan method, the focused electron beam is guided over the regions to be exposed. The beam spot may be shaped by a diaphragm. EBDW is distinguished by high flexibility, since the circuit geometries are stored in the computer and can be optionally varied. Furthermore, very high resolutions can be attained by electron beam writing, since electron foci with small diameters may be attained with electron-optical imaging systems. However, it is disadvantageous that the process is very time-consuming, due to the sequential, point-wise writing. EBDW is therefore at present mainly used for the production of the masks required in projection lithography.

In electron beam projection lithography, analogously to optical lithography, a larger portion of a mask is illuminated simultaneously and is imaged on a reduced scale on a wafer by means of projection optics. Since a whole field is imaged simultaneously in electron beam projection lithography, the attainable throughputs can be markedly higher in comparison with electron beam writers. Disadvantages of conventional electron beam projection lithography systems includes that a corresponding mask is necessary for each structure to be exposed. The preparation of customer-specific circuits in small numbers is not economic, because of the high costs associated with mask production.

SUMMARY

Figure 1:
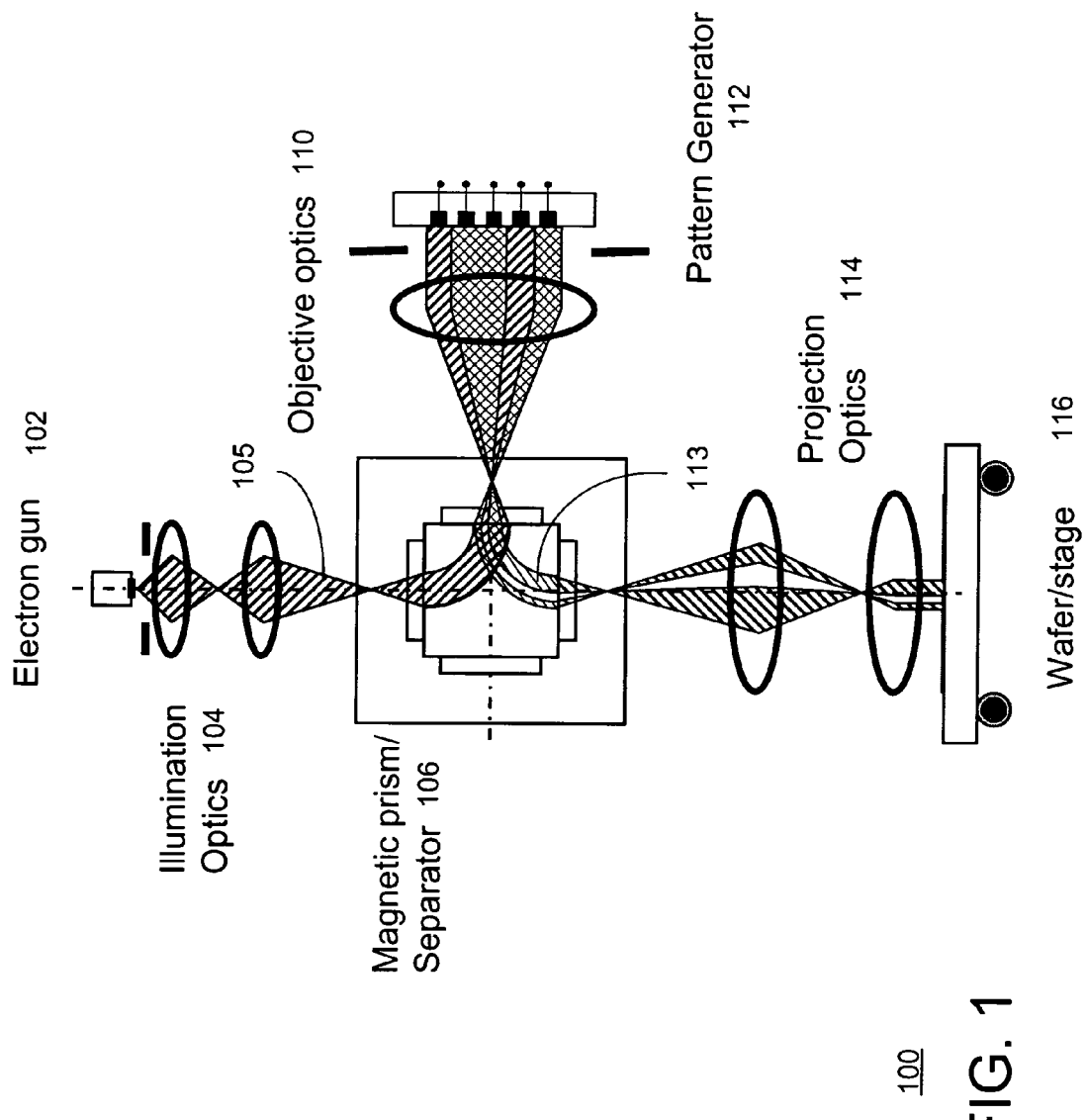
FIG. 1 is a schematic diagram of a maskless reflection electron beam projection lithography system in accordance with an embodiment of the invention.

One embodiment pertains to an apparatus for reflection electron beam lithography, including at least illumination electron-optics, an electron-reflective pattern generator, projection electron-optics, a moving stage holding a target substrate, control circuitry, and a deflection system. The illumination electron-optics is configured to form an illumination electron beam. The electron-reflective pattern generator is configured to generate an electron-reflective pattern of pixels and to reflect the illumination electron beam using the pattern to form a patterned electron beam. The projection electron-optics is configured to project the patterned electron beam onto the moving target substrate. The control circuitry is configured to shift the generated pattern in discrete steps in synchronization with the stage motion. The deflection system is configured to deflect said projected patterned electron beam so as to compensate for said stage motion in between discrete shifts of said generated pattern.

Another embodiment relates to a method of performing reflection electron beam lithography. An illumination electron beam is formed. An electron-reflective pattern of pixels is generated, and the illumination electron beam is reflected using the pattern to form a patterned electron beam. The patterned electron beam is projected onto a moving target substrate. The generated pattern is shifted in discrete steps in synchronization with the stage motion. Finally, the projected patterned electron beam is deflected so as to compensate for said stage motion in between said discrete shifts of said generated pattern.

Other features and embodiments are also disclosed.

DETAILED DESCRIPTION

Electron Beam Direct Write Lithography

As discussed above, electron-beam direct write (EBDW) lithography has the potential to achieve excellent resolution. However, EBDW has a traditional problem relating to its low throughput. For example, it may take ten to one hundred hours to inscribe an entire wafer using EBDW lithography. One previous approach to attempt to increase the throughput is by increasing the beam current. However, when the current and/or density exceeds a certain threshold, electron-electron interactions cause the beam to blur.

This patent application relates to a system and method of electron beam lithography that overcomes the above-discussed disadvantages and problems. Rather than focusing the electron beam into a small spot, the approach described herein floods the wafer with the electron beam. This enables use of a high beam current while keeping the beam current density at a level consistent with minimal electron-electron interactions. For example, an area roughly 0.1 millimeters (mm) wide may be illuminated. That area is several orders of magnitude larger than a traditional EBDW system that focuses the beam into a much smaller spot, for example, with a spot size on the order of tens of nanometers (nm) wide.

A flood beam 0.1 mm wide would normally not provide a writing resolution sufficiently high for practical use in integrated circuit manufacturing. However, the system and method disclosed herein enables high-resolution writing by partitioning the flood beam into a multitude (for example, four million) of independently controllable beams.

While others have tried building multiple columns with multiple sources to achieve multiple beams, there are various difficulties in that approach, including the difficulty of making the multiple columns behave uniformly. The system and method disclosed herein may be implemented using a single column and a single source.

A conventional multi-beam system would require a large array of blankers to achieve a multitude of controllable beams from a single column, each blanker being a small and independently controllable element that can be switched on and off rapidly. However, it is quite problematic to build and control such a large array. For example, a blanker array for a conventional multi-beam system cannot be not built using conventional integrated circuits technology because such integrated circuits are opaque to electrons.

The system and method disclosed herein re-directs the beam out of the direct line of sight between the electron source and the semiconductor wafer. Independently-controllable voltages are applied to cells of a dynamic pattern generator array that may be implemented using integrated circuit technology. The voltages determine whether each cell reflects electrons onto the wafer or absorbs electrons (preventing them from being reflected onto the wafer).

The system and method disclosed herein advantageously breaks through the traditional EBDW speed-versus-resolution tradeoff by illuminating a large area and simultaneously exposing a multitude of pixels on the wafer. For example, four million pixels may be exposed using a 4000×1000 array of individually addressable elements. This may be achieved using a single column and a conventional electron source.

FIG. 1 is a schematic diagram of a maskless reflection electron beam projection lithography system 100 in accordance with an embodiment of the invention. The name may be abbreviated to a reflection electron beam lithography or REBL system. As depicted, the system 100 includes an electron source 102, illumination electron-optics 104, a magnetic prism 106, an objective electron lens 110, a dynamic pattern generator (DPG) 112, projection electron-optics 114, and a stage 116 for holding a wafer or other target to be lithographically patterned. In accordance with an embodiment of the invention, the various components of the system 100 may be implemented as follows.

The electron source 102 may be implemented so as to supply a large current at low brightness (current per unit area per solid angle) over a large area. The large current is to achieve a high throughput rate. Preferably, the material of the source 102 will be capable of providing a brightness of about $10^4$ or $10^5$ A/cm$^2$ sr (Amperes per cm$^2$ steradian) at 50 keV. One implementation uses LaB$_6$, a conventional electron emitter, which typically have a brightness capability of about $10^6$ A/cm$^2$ sr at 50 keV, as the source material. Another implementation uses tungsten dispenser emitters, which typically have a brightness capability of about $10^5$ A/cm$^2$ sr when operating at 50 kilovolts, as the source material. Other possible emitter implementations include a tungsten Schottky cathode, or heated refractory metal disks (i.e. Ta).

The electron source 102 may be further implemented so as to have a low energy spread. The REBL system 100 should preferably control the energy of the electrons so that their turning points (the distance above the DPG 112 at which they reflect) are relatively constant, for example, to within about 100 nanometers. To keep the turning points to within about 100 nanometers, the electron source 102 would preferably have an energy spread no greater than 0.5 electron volts (eV). LaB$_6$ emitters have typical energy spreads of 1 to 2 eV, and tungsten dispenser emitters have typical energy spreads of 0.2-0.5 eV. In accordance with one embodiment of the invention, the source 102 comprises a LaB$_6$ source or tungsten Schottky emitter that is operated a few hundred degrees C. below its normal operating temperature to reduce the energy spread of the emitted electrons. However, cooler operating temperatures can destabilize the source 102, for example, due to impurities settling on the source surface and thereby diminishing its reliability and stability. Therefore, the source material may be preferably selected to be a material in which impurities are unlikely to migrate to the surface and choke off emission. Moreover, the vacuum on the system may be made better to overcome the impurity problem. Conventional lithography systems operate at a vacuum of $10^{-6}$ Torr. A scanning electron microscope (SEM) with a LaB$_6$ source typically operates at $10^{-7}$ Torr. A SEM with a Schottky emitter typically operates at $10^{-9}$ Torr or better in the gun region. In accordance with one implementation, the REBL operates with a gun region vacuum of $10^{-9}$ Torr or lower to protect the stability of the source 102.

The illumination electron-optics (illumination optics, for brevity) 104 is configured to receive and collimate the electron beam from the source 102. The illumination optics 104 allows the setting of the current illuminating the pattern generator structure 112 and therefore determines the electron dose used to expose the substrate. The illumination optics 104 may comprise an arrangement of magnetic and/or electrostatic lenses configured to focus the electrons from the source 102 so as to generate an incident electron beam 105. The specific details of the arrangement of lenses depend on specific parameters of the apparatus and may be determined by one of skill in the pertinent art.

The magnetic prism 106 is configured to receive the incident beam 105 from the illumination optics 104. When the incident beam traverses the magnetic fields of the prism, a force proportional to the magnetic field strengths acts on the electrons in a direction perpendicular to their trajectory (i.e. perpendicular to their velocity vectors). In particular, the trajectory of the incident beam 105 is bent towards the objective lens 110 and the dynamic pattern generator 112. In a preferred embodiment, the magnetic prism 106 is configured with a non-uniform magnetic field so as to provide stigmatic focusing, for example, as disclosed in U.S. patent application Ser. No. 10/775,646, entitled "Improved Prism Array for Electron Beam Inspection and Defect Review," filed Feb. 10, 2004 by inventor Marian Mankos, the disclosure of which is hereby incorporated by reference in its entirety. A uniform magnetic field provides astigmatic focusing wherein focusing occurs in only one direction (for example, so as to image a point as a line). In contrast, the magnetic prism 106 configuration should focus in both directions (so as to image a point as a point) because the prism 106 is also utilized for imaging. The stigmatic focusing of the prism 106 may be implemented by dividing it into smaller sub-regions with different but uniform magnetic fields. Furthermore, the lens elements in the prism 106 may be of a relatively longer length and width so as to provide for a low distortion image over a large field size. However, increasing the length of the prism 106 involves a trade-off of more electron-electron interactions causing more blur. Hence, the reduced image distortion should be balanced against the increased blur when increasing the prism length.

Below the magnetic prism 106, the electron-optical components of the objective optics are common to the illumination and projection subsystems. The objective optics may be configured to include the objective lens 110 and one or more transfer lenses (not shown). The objective optics receives the incident beam from the prism 106 and decelerates and focuses the incident electrons as they approach the DPG 112. The objective optics is preferably configured (in cooperation with the gun 102, illumination optics 104, and prism 106) as an immersion cathode lens and is utilized to deliver an effectively uniform current density (i.e. a relatively homogeneous flood beam) over a large area in a plane above the surface of the DPG 112. In one specific implementation, the objective lens 110 may be implemented to operate with a system operating voltage of 50 kilovolts. Other operating voltages may be used in other implementations.

The dynamic pattern generator 112 comprises an array of pixels. Each pixel may comprise a metal contact to which a voltage level is controllably applied. The principle of operation of the DPG 112 is described further below in relation to FIGS. 3A and 3B.

The extraction part of the objective lens 110 provides an extraction field in front of the DPG 112. As the reflected electrons 113 leave the DPG 112, the objective optics is configured to accelerate the reflected electrons 113 toward their second pass through the prism 106. The prism 106 is configured to receive the reflected electrons 113 from the transfer lens 108 and to bend the trajectories of the reflected electrons towards the projection optics 114.

The projection electron-optics (projection optics) 114 reside between the prism 106 and the wafer stage 116. The projection optics 114 is configured to focus the electron beam and demagnify the beam onto photoresist on a wafer or onto another target. The demagnification may range, for example, from 1× to 20× demagnification (i.e. 1× to 0.05× magnification). The blur and distortion due to the projection optics 114 is preferably a fraction of the pixel size. In one implementation, the pixel size may be, for example, 22.5 nanometers (nm). In such a case, the projection optics 114 preferably has aberrations and distortions on the order of a few tens of nm.

The wafer stage 116 holds the target wafer. In one embodiment, the stage 116 is stationary during the lithographic projection. In another embodiment, the stage 116 is in linear motion during the lithographic projection. In the case where the stage 116 is moving, the pattern on the DPG 112 may be dynamically adjusted to compensate for the motion such that the projected pattern moves in correspondence with the wafer movement. In other embodiments, the REBL system 100 may be applied to other targets besides semiconductor wafers. For example, the system 100 may be applied to reticles. The reticle manufacturing process is similar to the process by which a single integrated circuit layer is manufactured.

Figure 2:
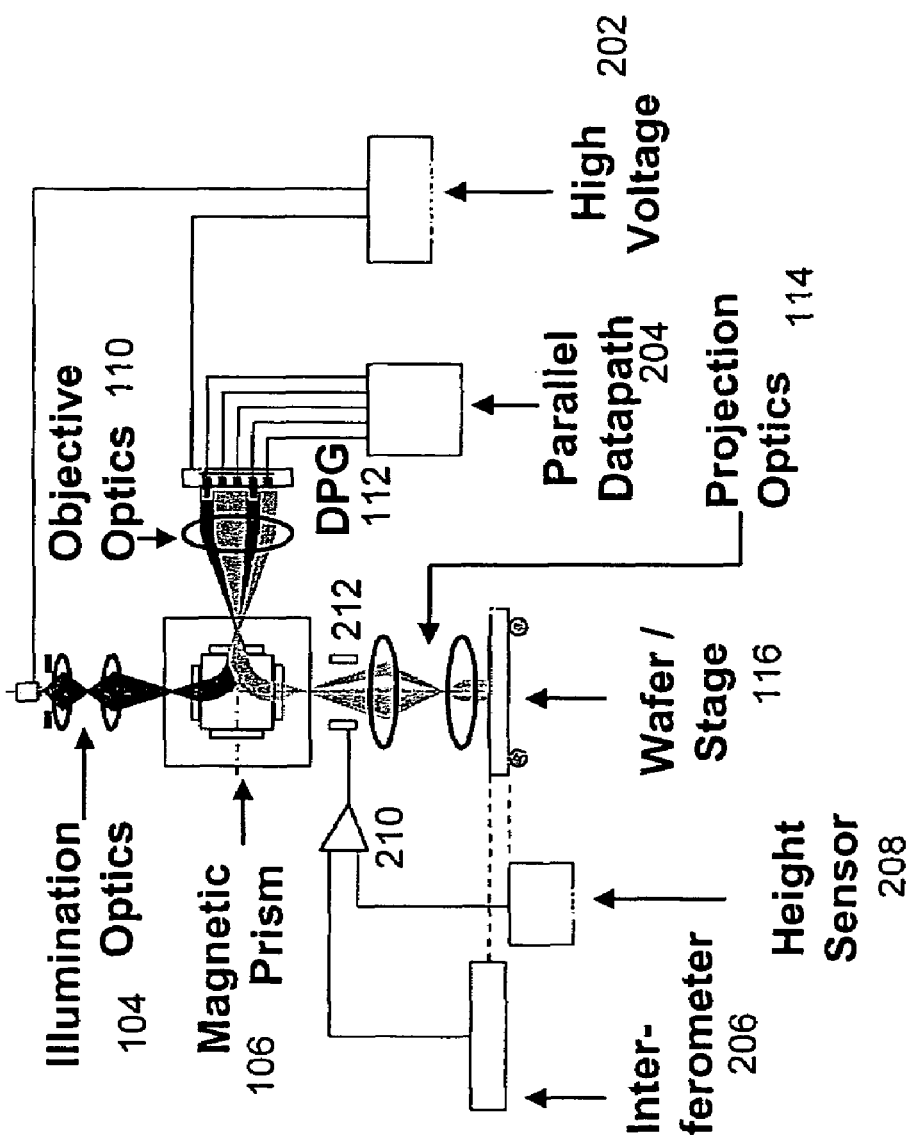
FIG. 2 is a schematic diagram of a maskless reflection electron beam projection lithography system showing further components in accordance with an embodiment of the invention.

FIG. 2 is a schematic diagram of a maskless reflection electron beam projection lithography system 200 showing further components in accordance with an embodiment of the invention. The additional components illustrated include a high voltage source 202, a parallel datapath 204, an interferometer 206, a height sensor 208, feedback circuitry 210, and beam deflectors 212.

The high voltage source 202 is shown as providing a high voltage to the source 102 and to the DPG 112. The voltage provided may be, for example, 50 kilovolts. The parallel data path 204 is configured to carry control signals to the DPG 112 for controlling the voltage on each pixel (so that it either absorbs electrons or reflects them).

In one embodiment, the control signals are adjusted so that the pattern moves electronically across the DPG pixel array in a manner that is substantially the same as the way signals move through a shift register and at a rate so as to match the linear movement of the wafer. In this embodiment, each exposed point on the wafer may receive reflected electrons from an entire column (or row) of DPG pixels, integrated over time. In one implementation of this embodiment, the DPG 112 is configured to resemble a static random access memory (SRAM) circuit, such as that depicted in FIG. 4.

In another embodiment, the control signals are such that the DPG 112 exposes one complete frame at a time. In this embodiment, each pixel on the DPG 112 exposes a corresponding pixel on the wafer. The pattern on the DPG 112 remains constant during the exposure of each frame. In one implementation of this embodiment, the DPG 112 is configured to resemble a dynamic random access memory (DRAM) circuit, such as that depicted in FIG. 5.

The interferometer 206 may be included to provide tight coupling and positional feedback between the electron beam location and the target on the wafer. In one embodiment, the optical beams are reflected off mirrors on the stage. The resulting interference pattern depends on the difference of the individual beam paths and allows accurate measurement of the stage and wafer position. As further described below in relation to FIG. 6, optical beams from the interferometer are diffracted from a grating on the target substrate surface, the resultant interference pattern is sensitive to the phase of the grating and can therefore deliver lateral positional information. Vertical positional information may be provided by a height sensor 208. The positional information may be fed back via feedback circuitry 210 so as to control beam deflectors 212. The deflectors 212 are configured to deflect the projected beam so as to compensate for vibrations and positional drift of the wafer.

Figure 3:
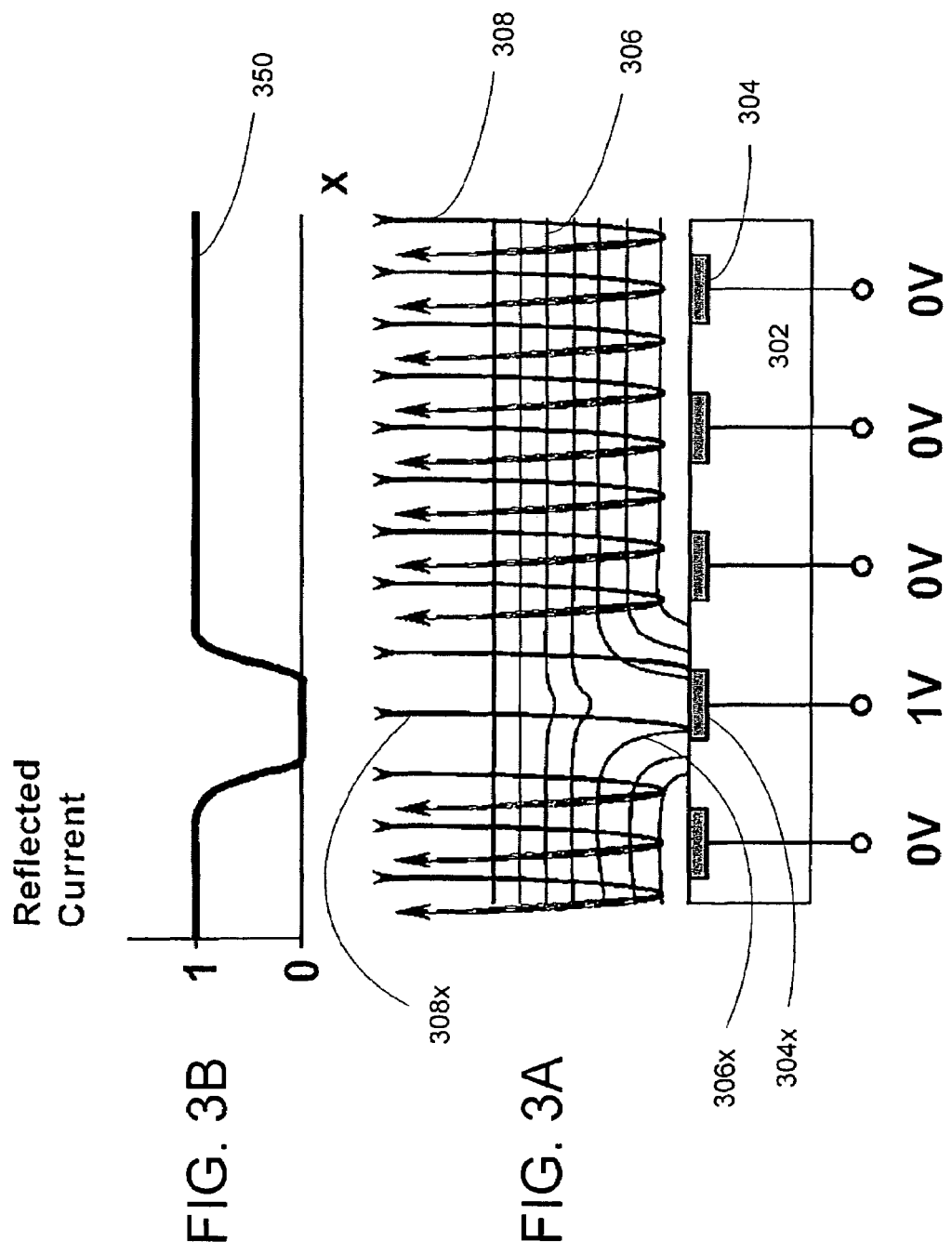
FIGS. 3A and 3B are diagrams illustrating the operation of a dynamic pattern generator in accordance with an embodiment of the invention.

FIGS. 3A and 3B are diagrams illustrating the operation of a dynamic pattern generator in accordance with an embodiment of the invention.

FIG. 3A shows a cross-section of a DPG substrate 302 showing a column (or row) of pixels. Each pixel includes a conductive area 304. A controlled voltage level is applied to each pixel. In the example illustrated in FIG. 3A, four of the pixels are "off" and have zero (0) volts applied thereto, while one pixel (with conductive area labeled 304x) is "on" and has one (1) volt applied thereto. (The specific voltages may vary depending on the parameters of the system.) The resultant local electrostatic equipotential lines 306 are shown, with distortions 306x relating to "off" pixel shown. In this example, the incident electrons 308 approaching the DPG 112 come to a halt in front of and are reflected by each of the "on" pixels, but the incident electrons 308x are drawn into and absorbed by the "off" pixel. The resultant reflected current (in arbitrary units) is shown in FIG. 3B. As seen from FIG. 3B, the reflected current is "0" for the "off" pixel and "1" for the "on" pixels.

Figure 4:
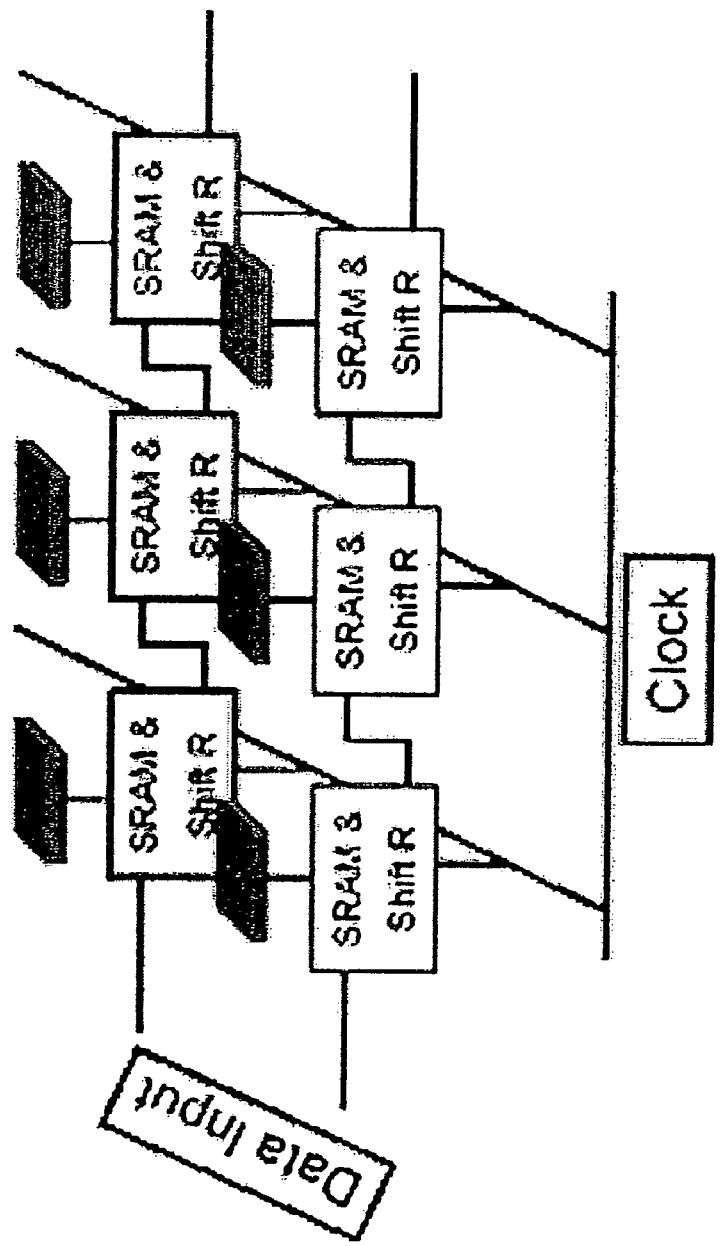
FIG. 4 is a schematic diagram of a dynamic pattern generator implemented in a circuit structure resembling a SRAM in accordance with an embodiment of the invention.

FIG. 4 is a schematic diagram of a dynamic pattern generator 212 implemented in a circuit structure resembling a SRAM in accordance with an embodiment of the invention.

In one embodiment, the SRAM-like DPG 212 is used in a "rolling mode" wherein the lithographic pattern is moved from one row of pixels into the next at the same rate at which the wafer scans under the electron beam. To expose a spot on the photoresist on a wafer, each pixel turns "on" (i.e. become reflective) as the spot passes "beneath" the pixel.

Figure 5:
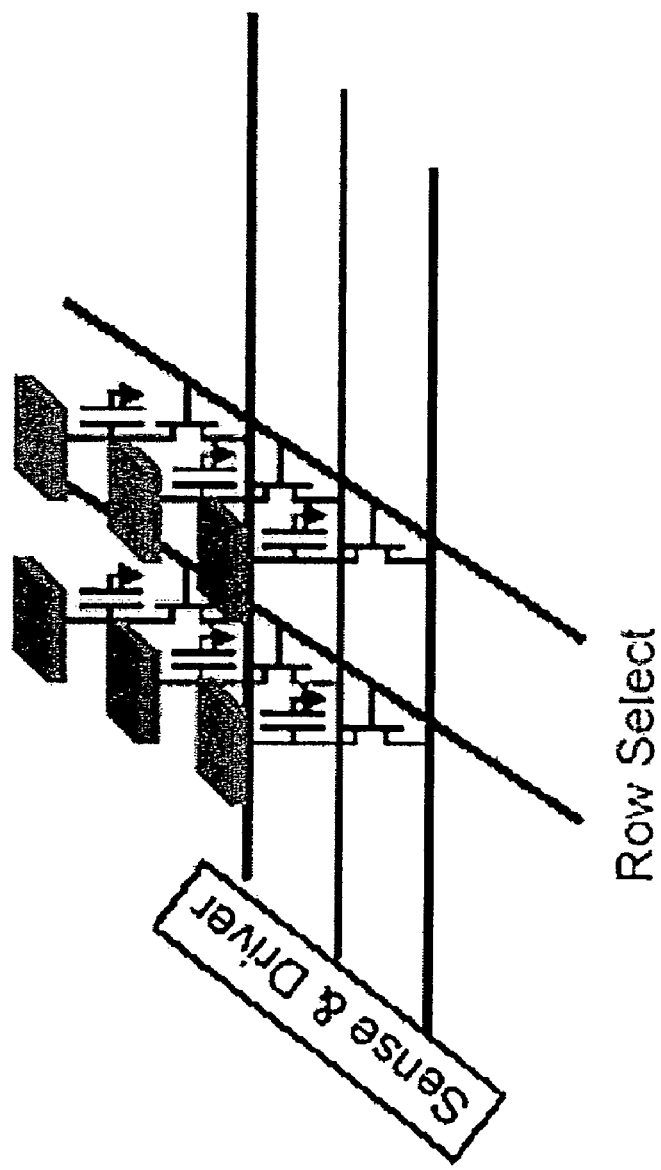
FIG. 5 is a schematic diagram of a dynamic pattern generator implemented in a circuit structure resembling a DRAM in accordance with an embodiment of the invention.

FIG. 5 is a schematic diagram of a dynamic pattern generator 212 implemented in a circuit structure resembling a DRAM in accordance with an embodiment of the invention. Here, each pixel may be implemented with as few as one transistor and one capacitor, so smaller pixels may be implemented. In one embodiment, the DRAM-like DPG 112 is used in "frame" (or "step-and-flash") mode. In frame mode, the DPG 112 exposes one frame at a time. Each DPG pixel exposes a corresponding pixel on the wafer, and the pattern on the DPG 112 remains constant during the exposure of each frame.

As described above, the DPG 112 comprises a programmable pattern generator structure. In an alternate embodiment, the system 100 may utilize a static patterned structure. As described above, the DPG 112 is utilized to generate a pattern with pixels either on or off. In an alternate embodiment, gray scale values for the pixels may be implemented. Gray scale values may be implemented, for example, by using a finer range of voltage values so as to provide control over the percentage (between 0% and 100%) of electrons reflected by a pixel. Alternatively, gray scale values may be implemented by varying the percentage of time over which each pixel remains on.

EBDW Lithography Applied to Moving Target Substrate

In rolling mode implementation, which is efficient for semiconductor manufacturing, the target substrate (for example, a semiconductor wafer) may be moved linearly in a continuous or nearly continuous manner by a moving stage 116 under the electron lithographic projection. In that case, the lithographic pattern being projected may be shifted across the pattern generator array 112 in a shift-register like manner. By synchronizing the shifting of the pattern on the generator 112 with the motion of the substrate under the projected electron beam, a result similar to step-and-flash exposure may be achieved, but on the moving substrate.

Electron Dosage Errors

While shifting the pattern on the generator array 112 in synchronization with the motion of the stage 116 does a reasonably good job of projecting the lithographic pattern onto the substrate, applicant has determined that electron dosage errors in some pixels do occur. Applicant has further determined that these dosage errors appear to be due to the performance of dosage modulation in a discrete fashion (i.e. the data moves through the individual generator array pixels in a step-wise fashion), while the stage is moved in a more continuous manner. In other words, discretization errors occur because the stage 116 (and hence the receiving pixels on the substrate) moves in a nearly continuous fashion while the pattern is shifted in more discrete steps at the generator array 112.

These discretization errors effectively increase blur in the scan direction (the direction of substrate motion) compared to the blur in the direction perpendicular to the scan direction. This difference in blur along and perpendicular to the stage scan direction causes dosage errors in some pixels during substrate exposure.

Two-Stage Compensatory Deflection System

Figure 6:
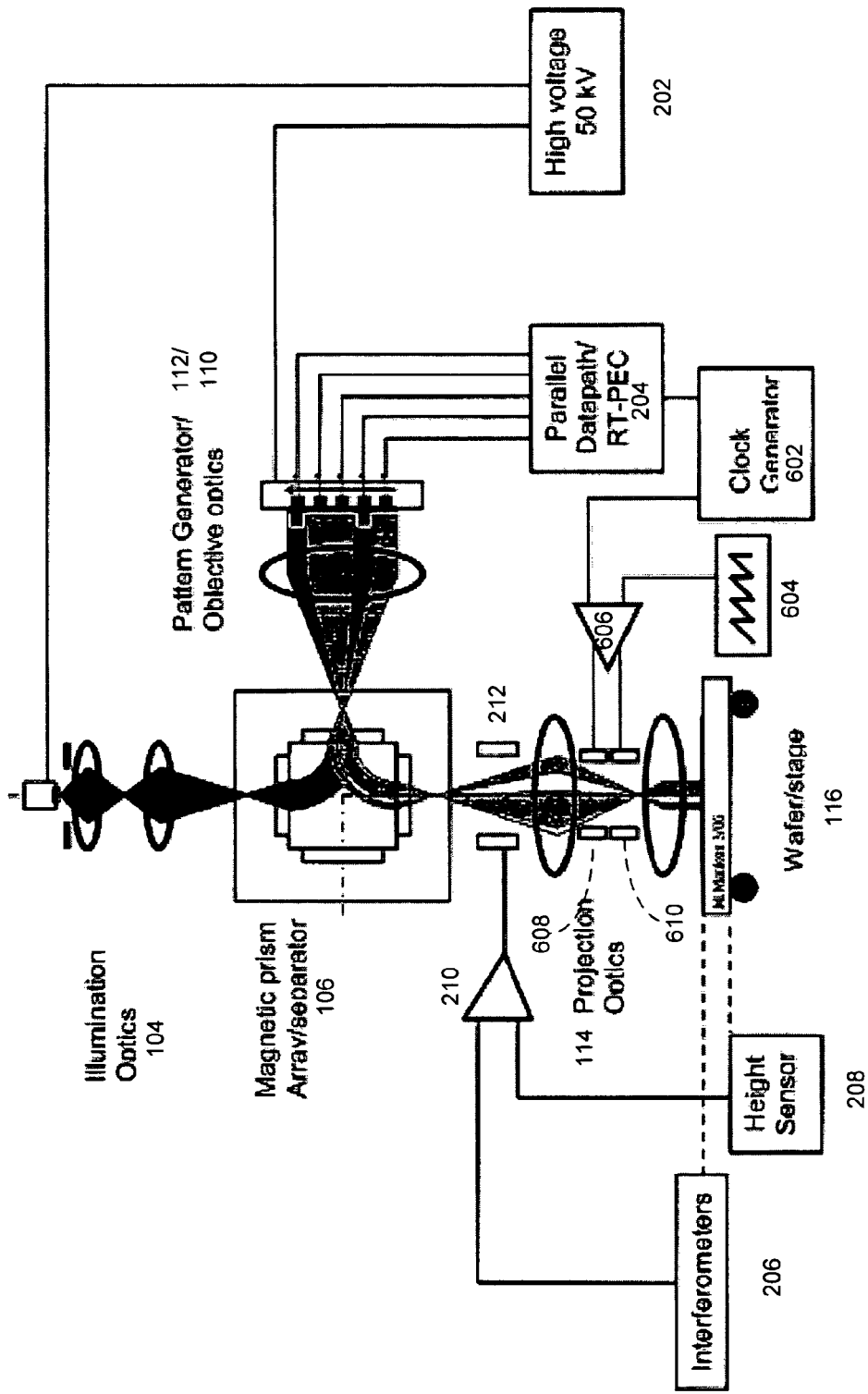
FIG. 6 is a schematic diagram of a maskless reflection electron beam projection lithography system including a two-stage compensatory deflection system in accordance with an embodiment of the invention.
Figure 7:
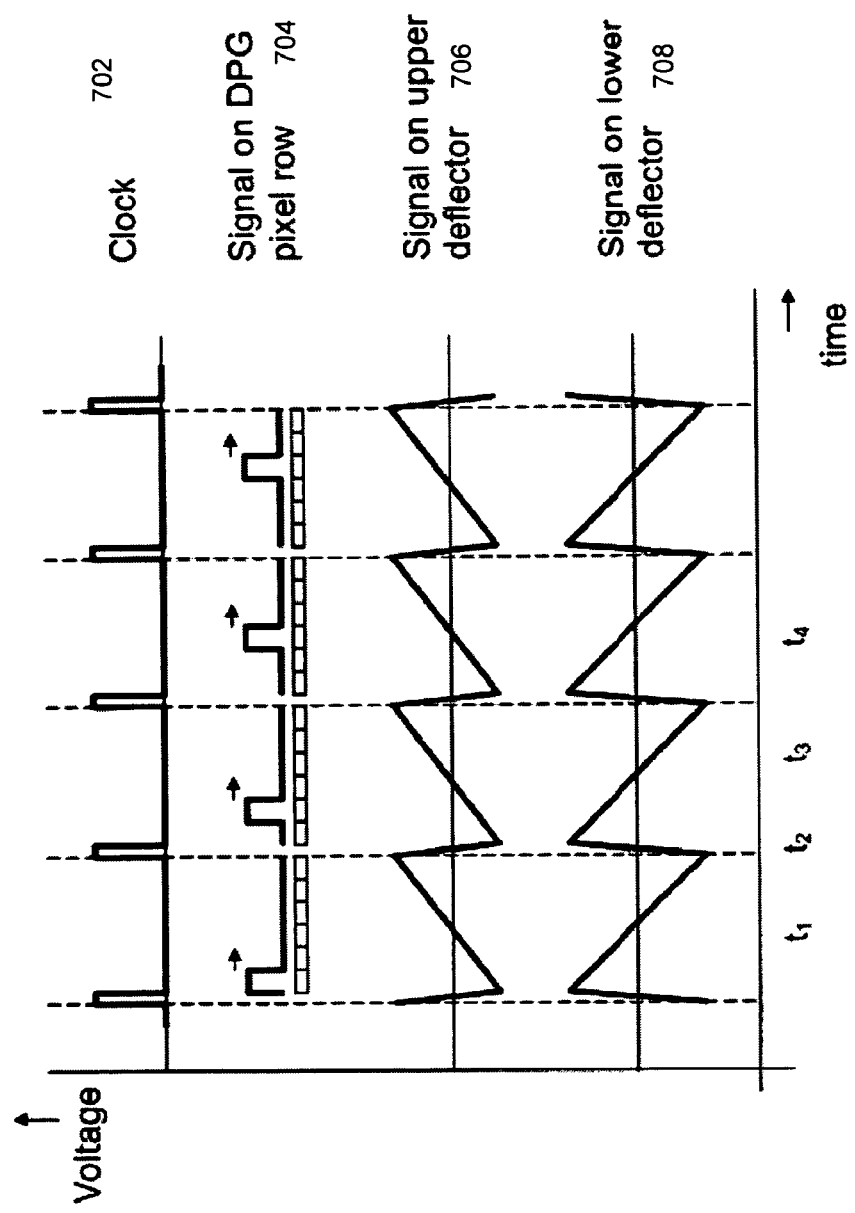
FIG. 7 is a timing diagram showing various electrical signals in accordance with an embodiment of the invention.

In accordance with an embodiment of the invention, FIG. 6 is a schematic diagram of a maskless reflection electron beam projection lithography system including a two-stage compensatory deflection system, and FIG. 7 is a timing diagram showing various electrical signals. As disclosed herein, the two-stage compensatory deflection system may be advantageously used to reduce or eliminate the electron dosage errors due to the above-discussed discretization errors.

In addition to various components discussed above in relation to FIGS. 1 and 2, FIG. 6 shows additional components relating to the deflection system, including a clock generator 602, a sawtooth waveform generator 604, deflector control circuitry 606, a first-stage (upper) deflector 608 and a second-stage (lower) deflector 610. As shown in FIG. 6, the deflectors are preferably located in the region of the projection electron-optics.

In a preferred embodiment, the deflectors are electrostatic deflectors. Electrostatic deflectors are operable at high frequencies which may be needed due to high pixel row shift frequencies. Such high pixel row shift frequencies (on the order of hundred megahertz, for example) may be required for high-throughput lithography applications. Other types of deflectors (for example, magnetic deflectors, or a combination of electrostatic and magnetic deflectors) may be used in alternate embodiments.

The clock generator 602 may be configured to generate a clock signal 702 that may include a series of pulses, as shown in FIG. 7. The clock signal 702 may be communicated to both the parallel datapath circuitry 204 and the deflector control circuitry 606.

At each clock pulse in the clock signal 702, the data in each pixel row of the pattern generator array 112 is transferred to the next pixel row, and the first pixel row receives the new row of data from the parallel datapath circuitry 204. This rolling transfer of data from pixel row to pixel row is depicted by the signal 704 in the timing diagram of FIG. 7.

During each clock period (i.e. between clock pulses), a portion of the lithographic pattern is statically present on the pattern generator array 112. However, while the projected pattern portion is static during each clock period at the generator array 112, the stage 116 is moving continuously or nearly continuously. Without compensation, this motion causes blur in the pattern as it is written on the target substrate.

In accordance with an embodiment of the invention, in order to compensate for such stage motion during each clock period, a deflection field is generated by a two-stage compensatory deflection system. The magnitude of the deflection changes over time so as to maintain the exposing electron beam in a stationary position on the stage 116 during the time period in which the signal is statically present at the generator array 112. At each clock pulse in the clock signal 702 (i.e. when the pixel rows are being shifted at the generator array 112), the beam quickly deflects back by one pixel spacing at the stage 116. In other words, the beam is deflected to follow the stage motion over one pixel width during a clock period (i.e. between clock pulses), and then snaps back by one pixel width when the next clock pulse is received. This process is repeated for each clock cycle.

In accordance with an embodiment of the invention, the beam deflection to follow the stage motion over one pixel width, then to snap back one pixel width, may be controlled by applying a first control signal 706 to the first-stage (upper) deflector 608 and a second control signal 708 to the second-stage (lower) deflector 610. These control signals (706 and 708) are depicted in the timing diagram of FIG. 7. As shown, these signals may have sawtooth forms and may further be "mirror images" of each other.

Figure 8:
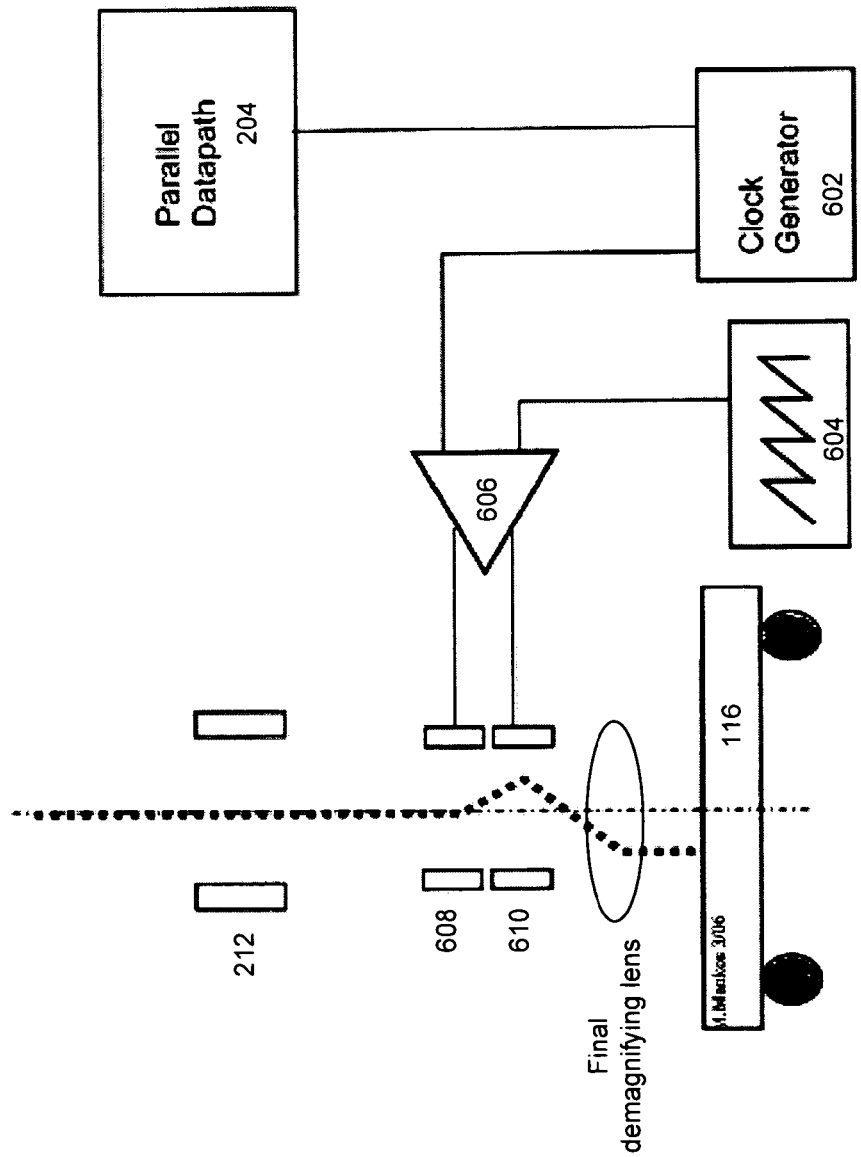
FIG. 8 is a schematic diagram illustrating the operation of the compensatory deflection system in accordance with an embodiment of the invention.

FIG. 8 is a schematic diagram illustrating the operation of the two-stage compensatory deflection system in accordance with an embodiment of the invention. As shown, the deflector control circuitry 606 receives both the clock signal 702 from the clock generator 602 and a sawtooth signal from the sawtooth signal generator 604.

The deflector control circuitry 606 synchronizes the sawtooth signal received from the sawtooth signal generator 604 with the clock signal 702 received from the clock generator 602. The deflector control circuitry 606 also generates a "mirror image" or complementary sawtooth signal based on the sawtooth signal. The synchronized sawtooth signal 704 is output by the deflector control circuitry 606 to the first (upper) deflector 608, and the synchronized complementary sawtooth signal 706 is output by the deflector control circuitry 606 to the second (lower) deflector 610.

Because the sawtooth control signals are complementary, the upper and lower deflectors (608 and 610) deflect the projected electron beam in opposite directions. In accordance with an embodiment of the invention, the pivoting point is located at the back focal plane of the final demagnifying lens (the lens closest to the target substrate) of the projection electron-optics 114. This enables the beam to land perpendicular or normal (or approximately so) to the substrate surface (see FIG. 8).

At the beginning of a clock period (right after the preceding clock pulse), the combined effect of the upper and lower deflections results in a starting deflection position for the projected electron beam. During a clock period (between clock pulses), the combined effect of the upper and lower deflections is to increasingly deflect the projected electron beam in the direction of the stage motion so as to track the stage motion. During the following clock pulse, the combined effect of the upper and lower deflections is to "snap back" (rapidly return) the projected electron beam to the starting deflection position. And so forth.

The approach disclosed in the present application provides a substantial advantage in reducing the blur which is otherwise introduced by the discretization error between the stage motion and the pattern shifting at the pattern generator. The reduced blur improves the print quality on a resist layer on a wafer and allows printing of finer features with higher resolution on the resist layer.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for reflection electron beam lithography, the apparatus comprising:

illumination electron-optics configured to form an illumination electron beam;

an electron-reflective pattern generator configured to generate an electron-reflective pattern of pixels and to reflect the illumination electron beam using the pattern to form a patterned electron beam;

projection electron-optics configured to project the patterned electron beam onto a target substrate;

a moving stage configured to hold the target substrate;

control circuitry configured to shift the generated pattern in discrete steps of one pixel width in synchronization with the stage motion; and a deflection system configured to deflect said projected patterned electron beam so as to compensate for said stage motion in between said discrete shifts of said generated pattern.

2. The apparatus of claim 1, wherein the deflection system comprises at least an upper deflector and a lower deflector.

3. The apparatus of claim 2, further comprising a clock generator which generates a clock signal that is used to trigger both the discrete shifts of the generated pattern and said compensatory deflection.

4. The apparatus of claim 3, further comprising circuitry configured to generate a sawtooth signal and a compensatory sawtooth signal which are used to control said compensatory deflection, and wherein the sawtooth signal and the complementary sawtooth signal are synchronized to the clock signal.

5. The apparatus of claim 4, wherein the sawtooth signal is applied to control one deflector and the complementary sawtooth signal is applied to control another deflector.

6. The apparatus of claim 5, wherein deflection of said projected patterned electron beam tracks said stage motion over one pixel width in between the discrete shifts and snaps back one pixel width during each of the discrete shifts.

7. The apparatus of claim 1, further comprising a beam separator configured to separate the patterned electron beam from the illumination electron beam.

8. The apparatus of claim 1, wherein said projected patterned electron beam is incident normal to a surface of the target substrate during said deflection.

9. The apparatus of claim 8, wherein the deflection system is configured such that a pivoting point of said deflection is located at a back focal plane of a final demagnifying lens of the projection electron-optics.

10. A method of performing reflection electron beam lithography, the method comprising:

forming an illumination electron beam;

generating an electron-reflective pattern of pixels;

reflecting the illumination electron beam using the pattern to form a patterned electron beam;

projecting the patterned electron beam onto a target substrate;

moving a stage configured holding the target substrate;

shifting the generated pattern in discrete steps of one pixel width in synchronization with the stage motion; and deflecting said projected patterned electron beam so as to compensate for said stage motion in between said discrete shifts of said generated pattern.

11. The method of claim 10, wherein said deflection is performed using at least an upper deflector and a lower deflector.

12. The method of claim 11, further comprising generating a clock signal that is used to trigger both the discrete shifts of the generated pattern and said compensatory deflection.

13. The method of claim 12, further comprising generating a sawtooth signal and a compensatory sawtooth signal which are synchronized to the clock signal and are used to control said compensatory deflection.

14. The method of claim 13, further comprising applying the sawtooth signal to control one deflector and applying the complementary sawtooth signal to control another deflector.

15. The method of claim 14, wherein deflection of said projected patterned electron beam tracks said stage motion over one pixel width in between the discrete shifts and snaps back one pixel width during each of the discrete shifts.

16. The method of claim 10, further comprising separating the patterned electron beam from the illumination electron beam.

17. The method of claim 10, wherein said projected patterned electron beam is incident normal to a surface of the target substrate during said deflection.

18. The method of claim 17, wherein the deflection system is configured such that a pivoting point of said deflection is located at a back focal plane of a final demagnifying lens of the projection electron-optics.

19. An apparatus for performing reflection electron beam lithography, the apparatus comprising:
  means for forming an illumination electron beam;
  means for generating an electron-reflective pattern of pixels;
  means for reflecting the illumination electron beam using the pattern to form a patterned electron beam;
  means for projecting the patterned electron beam onto a target substrate;
  means for moving a stage configured holding the target substrate;
  means for shifting the generated pattern in discrete steps of one pixel width in synchronization with the stage motion; and
  means for deflecting said projected patterned electron beam so as to compensate for said stage motion in between said discrete shifts of said generated pattern.

20. The apparatus of claim 19, wherein said projected patterned electron beam is incident normal to a surface of the target substrate during said deflection.

* * * * *